United States Patent
Martin

(12) 
(10) Patent No.: US 6,549,066 B1
(45) Date of Patent: Apr. 15, 2003

(54) EFFICIENT IMPLEMENTATION OF A COMPLEX FILTER WITH ON CHIP RESISTOR TUNING

(75) Inventor: Brian Martin, Carlsbad, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/934,158

(22) Filed: Aug. 21, 2001

(51) Int. Cl.[7] ................................................ H03K 5/00

(52) U.S. Cl. ....................................... 327/552; 327/558

(58) Field of Search ................................ 327/552, 554, 327/558; 341/143, 155

(56) References Cited

U.S. PATENT DOCUMENTS 3,916,322 A * 10/1975 Nelson ........................ 327/552
6,107,871 A * 8/2000 Shin ............................ 327/554
6,329,939 B1 * 12/2001 Swaminathan et al. ..... 341/143

* cited by examiner

*Primary Examiner*—Dinh T. Le
(74) *Attorney, Agent, or Firm*—Davis Munck, P.C.

(57) ABSTRACT

An apparatus is disclosed for implementing a complex filter of the type represented by a transfer function having a complex pole. The apparatus is capable of creating real and imaginary parts, $Y_r$ and $Y_i$, of a complex output signal in response to receiving real and imaginary parts, $X_r$ and $X_i$, of a complex input signal. The apparatus comprises a plurality of variable resistors that may be tuned to adjust various operating parameters of the complex filter.

22 Claims, 3 Drawing Sheets

EFFICIENT IMPLEMENTATION OF A COMPLEX FILTER WITH ON CHIP RESISTOR TUNING

CROSS REFERENCE TO RELATED APPLICATION

The present invention is related to that disclosed in U.S. patent application Ser. No. 09/778,540 filed on Feb. 7, 2001 by Brian C. Martin entitled "Resistor Tuning Network and Method for Microelectronic RC-Based Filters". U.S. patent application Ser. No. 09/778,540 is to be assigned to the assignee of the present invention. The disclosures within U.S. patent application Ser. No. 09/778,540 are hereby incorporated by reference for all purposes as if fully set forth herein.

FIELD OF THE INVENTION

The present invention relates in general to electronic filter technology and in particular to complex filters implemented in integrated circuits.

BACKGROUND OF THE INVENTION

Complex filters are useful in certain applications in wireless communications. Complex filters offer selective suppression of positive or negative frequency components of a complex or real signal. This feature of complex filters contrasts with the operation of real filters in that real filters have a transfer function that is symmetric around the direct current (DC) position. The ability of complex filters to suppress positive or negative frequency components enables the suppression of image frequencies of a signal. The suppression of image frequencies is a very important consideration in the design and operation of wireless transceivers.

A review of complex signals and complex filters will be useful to understand the present invention. A real signal may have both a positive frequency component and a negative frequency component. For example, a cosine signal cos ($\omega$t) equals ($e^{j\omega}+e^{-j\omega}$)/2 and a sine signal sin ($\omega$t) equals ($e^{j\omega}+e^{-j\omega}$)/2j. The letter j represents the square root of minus one. That is, $j^2=-1$. The letter j therefore represents one imaginary unit.

A complex signal is a signal that is composed of two real signals in which one of the real signals is multiplied by j. A complex signal therefore has the form:

$$x(t)=x_r(t)+j\, x_i(t) \quad (1)$$

where $x_r(t)$ is a real signal that represents the real component of the complex signal x(t) and where $x_i(t)$ is a real signal that represents the imaginary component of the complex signal x(t).

A complex signal x(t) may be amplified by multiplication by a complex constant A+j B. For example, let y(t) be the result of multiplying the complex signal x(t) by the complex constant A+j B. Then $$y(t)=(A+j\, B)\, x(t) \quad (2)$$

where $$y(t)=y_r(t)+j\, y_i(t). \quad (3)$$

The expression $Y_r(t)$ represents a real signal that is the real component of the complex signal y(t) and the expression $y_i(t)$ represents a real signal that is the imaginary component of the complex signal y(t).

Substituting Equation (1) into Equation (2) and multiplying and equating the real and imaginary parts of the result with y(t) gives:

$$Y_r(t)=A\, x_r(t)-B\, x_i(t) \quad (4)$$

and $$y_i(t)=B\, x_r(t)+A\, x_i(t). \quad (5)$$

Similarly, a complex signal x(t) may be multiplied by another complex signal z(t) where $$z(t)=Z_r(t)+j\, z_i(t). \quad (6)$$

The multiplication of x(t) by z(t) is represented by:

$$y(t)=z(t)\cdot x(t) \quad (7)$$

The result of multiplying x(t) by z(t) may be obtained by substituting Equation (6) into Equation (7) and multiplying and equating the real and imaginary parts of the result with y(t). The result is:

$$y_r(t)=z_r(t)x_r(t)-z_i(t)x_i(t) \quad (8)$$

and $$y_i(t)=Z_r(t)x_r(t)+z_i(t)x_i(t). \quad (9)$$

Complex signals may be filtered by real filters or by complex filters. A real filter has a real impulse response $h_r(t)$. The transfer function $H_r(j\omega)$ is a rational polynomial function of j$\omega$. The transfer function $H_r(j\omega)$ can be real only if $H_r(j\omega)=H_r^*(-j\omega)$.

A complex filter has a complex impulse response $$h(t)=h_r(t)+j\, h_i(t) \quad (10)$$

and a complex transfer function $$H(j\omega)=H_r(j\omega)+j\, H_i(107). \quad (11)$$

The response of a linear time invariant system to an arbitrary input x(t) can be expressed as the convolution of x(t) and the impulse response h(t) of the system. That is, $$y(t)=h(t)\bigcirc x(t) \quad (12)$$

where the symbol $\bigcirc$ represents the convolution operation. Applying the well known time convolution theorem of the Fourier transform to Equation (12) gives:

$$Y(j\omega)=H(j\omega)\cdot x(j\omega) \quad (13)$$

where Y(j$\omega$) is a complex output signal and X(j$\omega$) is a complex input signal. H(j$\omega$) is a rational complex polynomial that is a function of j$\omega$.

Because the input signal X(j$\omega$) is complex, X(j$\omega$) is composed of a real part and an imaginary part.

$$X(j\omega)=X_r(j\omega)+j\, X_i(j\omega). \quad (14)$$

where $X_r(j\omega)$ represents the real part of X(j$\omega$) and where $X_i(j\omega)$ represents the imaginary part of X(j$\omega$). Similarly, because the output signal Y(j$\omega$) is also complex, Y(j$\omega$) is also composed of a real part and an imaginary part.

$$Y(j\omega)=Y_r(j\omega)+j\, Y_i(j\omega). \quad (15)$$

where $Y_r(j\omega)$ represents the real part of Y(j$\omega$) and where $Y_i(j\omega)$ represents the imaginary part of Y(j$\omega$).

Substituting Equations (11), (14) and (15) into Equation (13) and multiplying and equating the real and imaginary parts of the result to the real and imaginary parts of $Y(j\omega)$ gives:

$$Y_r(j\omega)=H_r(j\omega)\cdot X_r(j\omega)-H_i(j\omega)X_i(j\omega) \qquad (14a)$$

$$Y_i(j\omega)=H_r(j\omega)X_i(j\omega)+H_i(j\omega)X_r(j\omega) \qquad (15a)$$

In the time domain Equations (14a) and (15a) give:

$$y_r(t)=h_r(t)\bigcirc x_r(t)-h_i(t)\bigcirc x_i(t) \qquad (16)$$

$$y_i(t)=h_r(t)\bigcirc x_i(t)+h_i(t)\bigcirc x_r(t) \qquad (17)$$

where the symbol $\bigcirc$ represents the convolution operation.

The equation of a transfer function having a complex pole has the form:

$$H(j\omega) = \frac{A}{s + (p \pm jq)} \qquad (18)$$

The letter A represents a constant. The letter s represents the quantity $j\omega$. The letter p represents the real part of the complex pole and the letter q represents the imaginary part of the complex pole. Substitution of Equation (18) into Equation (13) gives:

$$Y(j\omega) = \frac{A}{s + (p \pm jq)} \cdot X(j\omega) \qquad (19)$$

One of the main applications for complex filters is the selective suppression of positive or negative frequency components of a complex or real signal. This may be accomplished by using a bandpass filter that is obtained from the linear frequency transformation of a lowpass filter. A complex lowpass filter that is centered on the direct current (DC) value (i.e., $j\omega=0$) of the $j\omega$ axis of a $H(j\omega)/j\omega$ plane may be linearly transformed to create a complex bandpass filter that is centered on another value, $j\omega_c$, of the $j\omega$ axis.

Using the linear transformation $$s=j\omega-j\omega_c \qquad (20)$$

will result in a bandpass filter that has the form of the lowpass filter but is centered around the frequency $\omega_c$. This form of bandpass filter has only the frequency shifted lowpass filter characteristics for positive frequencies. The transfer function of this form of bandpass filter suppresses negative frequency components.

Substituting Equation (20) into Equation (19) leads to the following design equations for the real and imaginary parts of the output signal $Y(j\omega)$. The argument $j\omega$ in the expressions $Y(j\omega)$ and $X(j\omega)$ in Equations (21) and (22) will be omitted for clarity.

$$Y_r = \frac{X_r - \frac{\omega_C}{A}Y_i - \frac{p}{A}Y_r \pm \frac{q}{A}Y_i}{j\frac{\omega}{A}} \qquad (21)$$

$$Y_i = \frac{X_i - \frac{\omega_C}{A}Y_r - \frac{p}{A}Y_i \mp \frac{q}{A}Y_r}{j\frac{\omega}{A}} \qquad (22)$$

It would be desirable to provide circuitry on an integrated circuit that is capable of implementing a complex filter of the type represented by a transfer function having a complex pole. In particular, it would be desirable to provide an apparatus for providing the real part $Y_r(j\omega)$ and imaginary part $Y_i(j\omega)$ of an output signal $Y(j\omega)$ that results from multiplying an input signal $X(j\omega)$ by a transfer function $H(j\omega)$ that has a complex pole.

SUMMARY OF THE INVENTION

The apparatus of the invention comprises circuitry that is capable of implementing a complex filter of the type that is represented by a transfer function having a complex pole. The apparatus creates real and imaginary parts, $Y_r(j\omega)$ and $Y_i(j\omega)$, of a complex output signal from real and imaginary parts, $X_r(j\omega)$ and $X_i(j\omega)$, of a complex input signal by implementing a transfer function that has a complex pole. The apparatus generally comprises an operational amplifier circuit and an input circuit comprising a plurality of input resistors. The input resistors in the input circuit may be variable and may be tuned to adjust various operating parameters of the complex filter.

It is an object of the present invention to provide an apparatus for implementing a complex filter of the type that is represented by a transfer function having a complex pole.

It is also an object of the present invention to provide an apparatus for providing the real part $Y_r(j\omega)$ and imaginary part $Y_i(j\omega)$ of an output signal $Y(j\omega)$ that results from multiplying an input signal $X(j\omega)$ by a transfer function $H(j\omega)$ that contains a complex pole.

It is another object of the present invention to provide an apparatus for implementing a complex filter where the apparatus comprises a plurality of variable resistors that may be tuned to adjust operating parameters of the complex filter.

It is a further object of the present invention to provide an apparatus for implementing a complex filter where the apparatus comprises a plurality of variable resistors in which each resistor may be independently tuned to adjust operating parameters of the complex filter.

It is yet another object of the present invention to provide an apparatus for implementing a complex filter where the apparatus comprises a plurality of variable resistor pairs in which each resistor pair may be independently tuned to adjust operating parameters of the complex filter.

Other objects and advantages of the invention will become apparent as the description proceeds.

The foregoing has outlined rather broadly the features and technical advantages of the present invention so that those skilled in the art may better understand the Detailed Description of the Invention that follows. Additional features and advantages of the invention will be described hereinafter that form the subject matter of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention, it may be advantageous to set forth definitions of certain words and phrases used throughout this patent document: The terms "include" and "comprise" and derivatives thereof, mean inclusion without limitation, the term "or" is inclusive, meaning "and/or"; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, to bound to or with, have, have a property of, or the like; and the term "controller," "processor," or "apparatus" means any device, system or part thereof that controls at least one operation. Such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document. Those of ordinary skill should understand that in many instances (if not in most instances), such definitions apply to prior, as well as future uses of such defined words and phrases.

BRIEF DESCRIPTION OF THE DRAWINGS

For a more complete understanding of the present invention, and the advantages thereof, reference is now made to the following descriptions taking in conjunction with the accompanying drawings, wherein like numbers designate like objects, and in which.

DETAILED DESCRIPTION OF THE INVENTION

Figure 1:
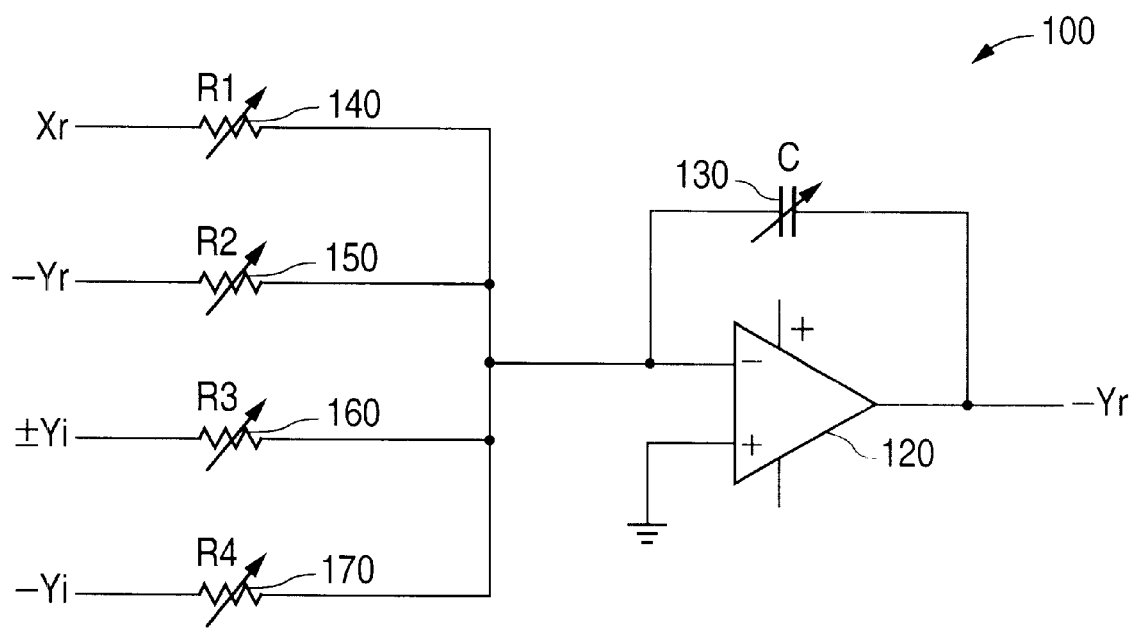
FIG. 1 schematically illustrates an advantageous embodiment of a first circuit for representing a first portion of a complex filter with a complex pole.
Figure 2:
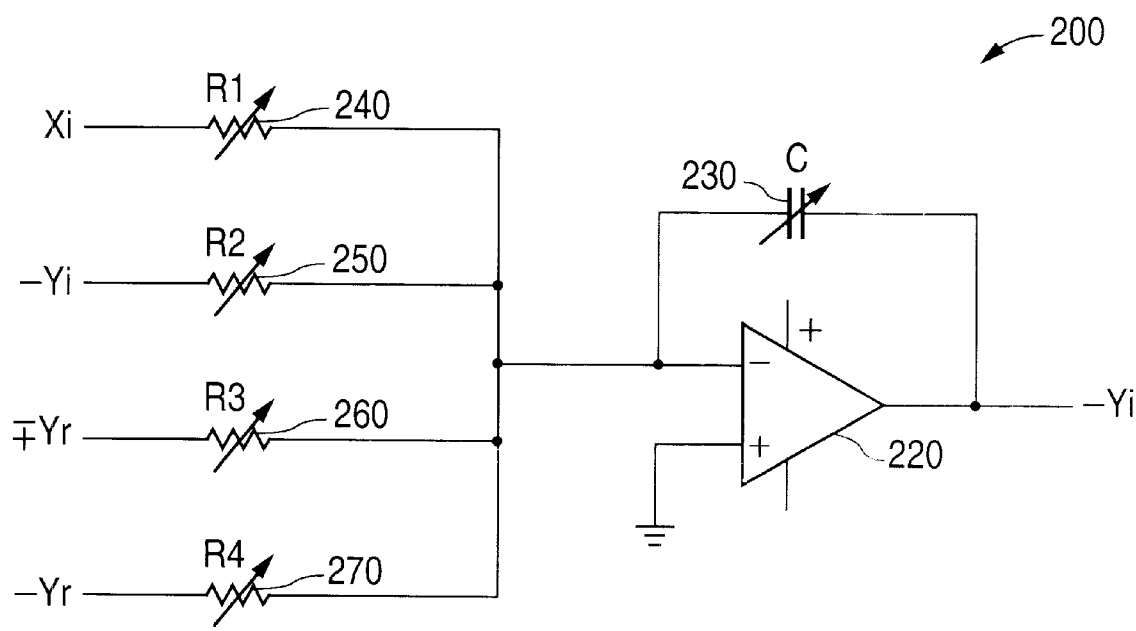
FIG. 2 schematically illustrates an advantageous embodiment of a second circuit for representing a second portion of a complex filter with a complex pole.

FIG. 1 schematically illustrates a first circuit 100 for representing a first portion of a complex filter with a complex pole. FIG. 2 schematically illustrates a second circuit 200 for representing a second portion of a complex filter with a complex pole. As will be more fully described, first circuit 100 produces the value of the real part $Y_r$ of the output of a complex filter described in Equation (21) and second circuit 200 produces the value of the imaginary part $Y_i$ of the output of a complex filter described in Equation (22).

Circuit 100 comprises four resistors coupled in parallel. The four resistors in circuit 100 include resistor 140 having a value of R1 ohms, resistor 150 having a value of R2 ohms, resistor 160 having a value of R3 ohms, and resistor 170 having a value of R4 ohms. Resistors 140, 150, 160 and 170 are variable resistors and may be tuned by a resistor tuning device. One example of a resistor tuning device for tuning integrated circuit resistors is set forth and described in U.S. patent application Ser. No. 09/778,540 filed by Brian C. Martin on Feb. 7, 2001 entitled "Resistor Tuning Network and Method for Microelectronic RC-Based Filters." The disclosures within U.S. patent application Ser. No. 09/778, 540 are hereby incorporated by reference for all purposes as if fully set forth herein.

An output signal from each of the four variable resistors 140, 150, 160 and 170 is combined and fed into the inverting input of op amp 120. The output of op amp 120 is coupled to the inverting output of op amp 120 through capacitor 130 having a value of C farads. Capacitor 130 may be a variable capacitor that may be tuned by a capacitor tuning device.

As shown in FIG. 1, the input signal $X_r$ is connected to resistor 140. The output signal $-Y_r$ is obtained from the output of op amp 120 and is fed back to resistor 150. As will be described more fully below, op amp 220 in FIG. 2 produces output signal $-Y_i$. The output signal $-Y_i$ is obtained from the output of op amp 220 in FIG. 2 and fed back to resistor 170 in FIG. 1. Lastly, the value of $\pm Y_i$ (obtained from the value of output signal $-Y_i$) is provided to resistor 160. It is noted that both polarities of the output signals $Y_r$ and $Y_i$ are necessary to correctly implement circuit 100 and circuit 200.

The equation for the output $-Y_r$ of circuit 100 is:

$$-Y_r = \frac{X_r}{sR1C} - \frac{Y_r}{sR2C} \pm \frac{Y_i}{sR3C} - \frac{Y_i}{sR4C} \qquad (23)$$

By substituting jω for s in Equation (23) it may be demonstrated that circuit 100 implements Equation (21) where $R1=1/(A\ C)$ (24)

$R2=1/(p\ C)$ (25)

$R3=1/(q\ C)$ (26)

and $R4=1/(\omega_c C)$. (27)

Turning now to FIG. 2, one sees that circuit 200 also comprises four resistors coupled in parallel. The four resistors in circuit 200 include resistor 240 having a value of R1 ohms, resistor 250 having a value of R2 ohms, resistor 260 having a value of R3 ohms, and resistor 270 having a value of R4 ohms. Resistors 240, 250, 260 and 270 are variable resistors and may be tuned by a resistor tuning device.

An output signal from each of the four variable resistors 240, 250, 260 and 270 is combined and fed into the inverting input of op amp 220. The output of op amp 220 is coupled to the inverting input of op amp 220 through capacitor 230 having a value of C farads. Capacitor 230 may be a variable capacitor that may be tuned by a capacitor tuning device.

As shown in FIG. 2, the input signal $X_i$ is connected to resistor 240. The output signal $-Y_i$ is obtained from the output of op amp 220 and is fed back to resistor 250. As previously described, op amp 120 in FIG. 1 produces output signal $-Y_r$. The output signal $-Y_r$ is obtained from the output of op amp 120 in FIG. 1 and fed back to resistor 270 in FIG. 2. Lastly, the value of $\mp Y_r$ (obtained from the value of output signal $-Y_r$) is provided to resistor 260.

The equation for the output $-Y_i$ of circuit 200 is:

$$-Y_i = \frac{X_i}{sR1C} - \frac{Y_i}{sR2C} \mp \frac{Y_r}{sR3C} + \frac{Y_r}{sR4C} \qquad (28)$$

By substituting jω for s in Equation (28) it may be demonstrated that circuit 200 implements Equation (22) where $R1=1/(A\ C)$ (29)

$R2=1/(p\ C)$ (30)

$R3=1/(q\ C)$ (31)

and $R4=1/(\omega_c C)$. (32)

The value R1 is the same for both resistor 140 and resistor 240. The value R2 is the same for both resistor 150 and resistor 250. Similarly, the value R3 is the same for both resistor 160 and resistor 260. Lastly, the value R4 is the same for both resistor 170 and resistor 270.

Two resistors with the same value form a resistor pair. That is, resistor 140 and resistor 240 form a first resistor pair where each resistor has a value of R1 ohms. Resistor 150 and resistor 250 form a second resistor pair where each resistor has a value of R2 ohms. Resistor 160 and resistor 260 form a third resistor pair where each resistor has a value of R3 ohms. Lastly, resistor 170 and resistor 270 form a fourth resistor pair where each resistor has a value of R4 ohms.

By keeping the resistors distinct (as opposed to combining resistor 160 and resistor 170, for example) each resistor pair controls a different aspect of the complex pole independently of the other resistor pairs. Specifically, the value of R1 ohms sets the gain of the filter. The value of R2 ohms sets the value of the real part of the complex pole. The value of R3 ohms sets the value of the imaginary part of the complex pole. The value of R4 ohms controls the low pass to band pass translation of the complex pole. That is, the value of R4 ohms sets the center frequency.

The advantageous embodiment of the present invention shown in FIG. 1 and in FIG. 2 employs resistors and capacitors that are variable in value (i.e., tunable). The use of tunable resistors and capacitors provides several advantages. First, integrated continuous time filters generally suffer in performance due to variations in the resistor values and variations in the capacitor values that occur during the manufacturing process. Compensation for such variations can be accomplished by tuning the resistors and capacitors. This type of tuning is usually performed by varying the capacitor values because there are fewer elements to tune.

Second, if the resistors are made independently tunable, then the filter can be tuned (1) to compensate for op amp imperfections by tuning the R2 and R3 values, or (2) to adjust the gain by tuning the R1 value, or (3) to readjust the center of the filter by tuning the R4 value.

Tuning the R1 value allows the filter to be incorporated into an automatic gain control (AGC) loop for use in radios and similar equipment. Tuning the R4 value to change the center frequency allows a radio, for example, to maximize performance by centering the filter more exactly on a desired signal.

As previously described, one advantageous embodiment of the invention comprises independently tunable resistors. Another alternate advantageous embodiment of the present invention may comprise independently tunable resistor pairs. Yet another alternate advantageous embodiment of the present invention may comprise resistors in which only one resistor pair is independently tunable. Still another alternate advantageous embodiment of the present invention may comprise resistors connected in an R-2R ladder. Another alternate advantageous embodiment of the present invention may comprise resistors that are digitally tunable.

In general complex poles are used in conjugate pairs. Conjugate pairs of complex poles may be formed by cascading two complex pole circuits. For example, in circuit 100 of FIG. 1 and in circuit 200 of FIG. 2 it is possible to use the positive polarity of $Y_i$ at the input of resistor 160 and the negative polarity of $Y_r$ at the input of resistor 260 to implement one of the conjugates. The other conjugate can be created by using the negative polarity of $Y_i$ at the input of resistor 160 and the positive polarity of $Y_r$ at the input of resistor 260. In general, most filter functions can be implemented by cascading several stages of complex poles.

Figure 3:
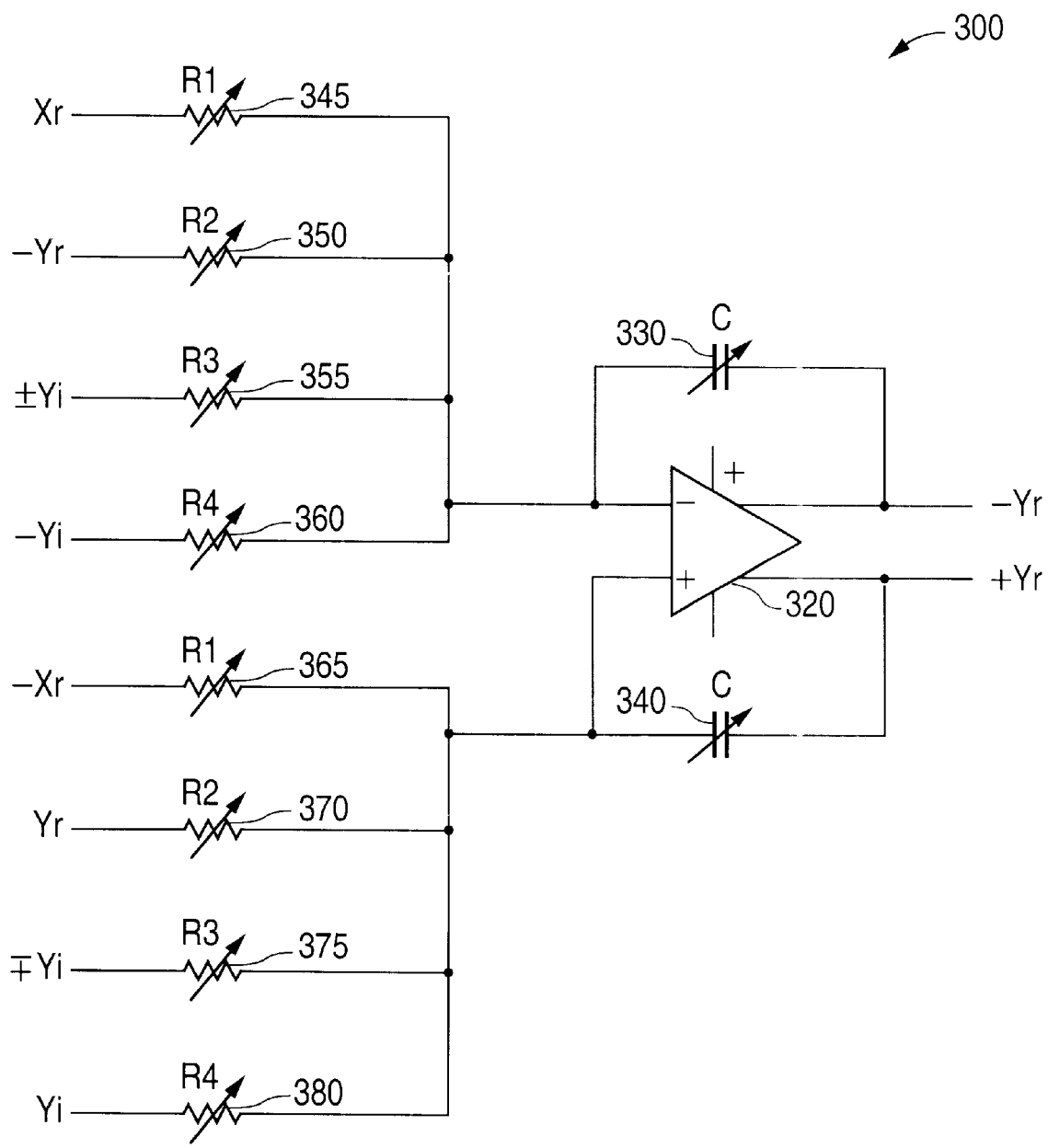
FIG. 3 schematically illustrates an alternate advantageous embodiment of the present invention comprising a differential form of the circuit shown in FIG. 1.

FIG. 3 schematically illustrates an alternate advantageous embodiment of the present invention comprising a differential form 300 of circuit 100 shown in FIG. 1. Circuit 300 produces both a positive and negative value of the real part $Y_r$ of the output of a complex filter described in Equation (21)

Figure 4:
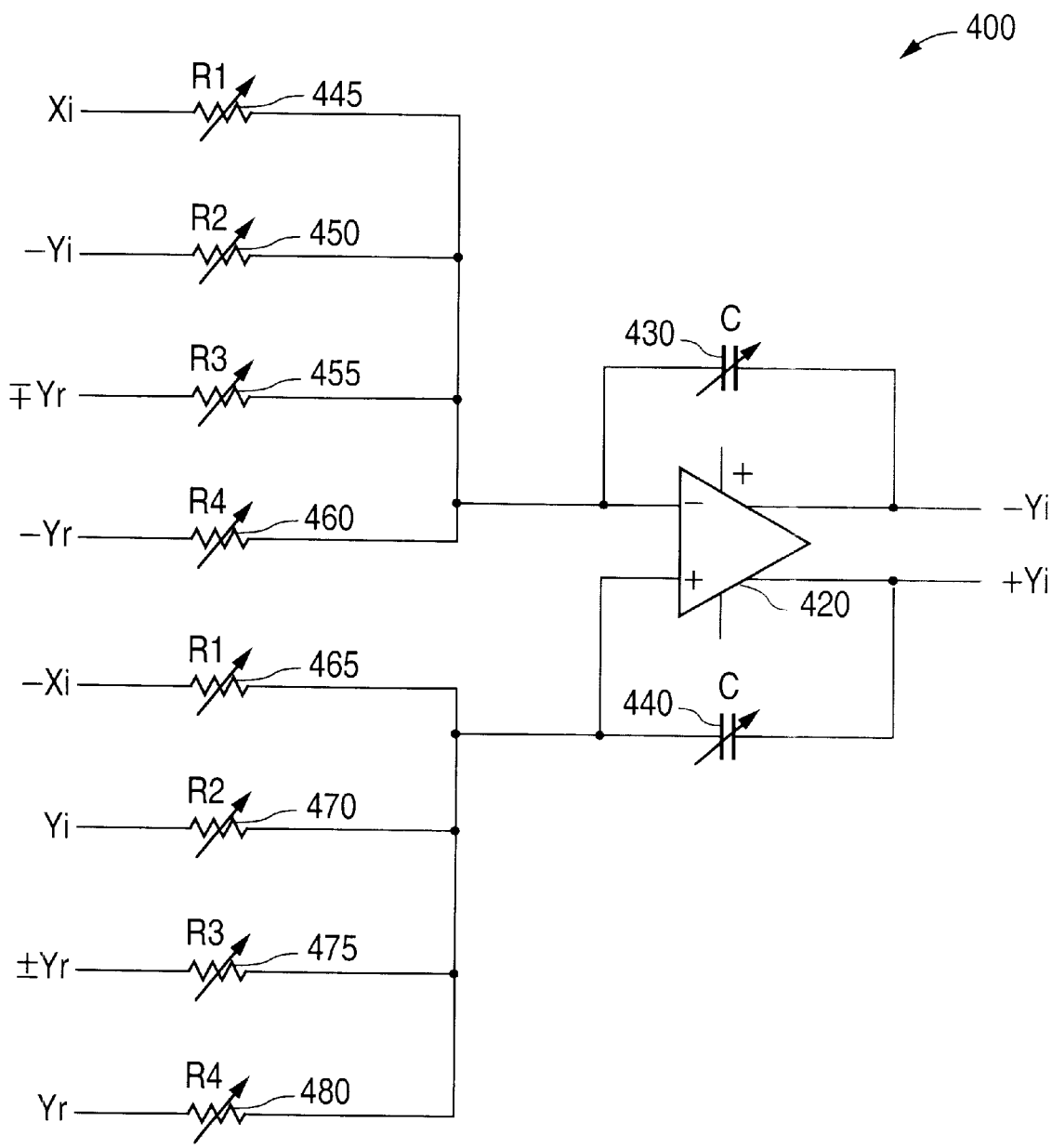
FIG. 4 schematically illustrates an alternate advantageous embodiment of the present invention comprising a differential form of the circuit shown in FIG. 2.

FIG. 4 schematically illustrates an alternate advantageous embodiment of the present invention comprising a differential form 400 of circuit 200 shown in FIG. 2. Circuit 400 produces both a positive and negative value of the imaginary part $Y_i$ of the output of a complex filter described in Equation (22).

Circuit 300 of FIG. 3 comprises two sets of four resistors coupled in parallel. The first set of four resistors in circuit 300 includes resistor 345 having a value of R1 ohms, resistor 350 having a value of R2 ohms, resistor 355 having a value of R3 ohms, and resistor 360 having a value of R4 ohms. Resistors 345, 350, 355 and 360 are variable resistors and may be tuned by a resistor tuning device.

An output signal from each of the four variable resistors 340, 350, 355 and 360 is combined and fed into the inverting input of op amp 320. The inverting output of op amp 320 is coupled to the inverting input of op amp 320 through capacitor 330 having a value of C farads. Capacitor 330 may be a variable capacitor that may be tuned by a capacitor tuning device.

As shown in FIG. 3, the input signal $X_r$ is connected to resistor 345. The output signal $-Y_r$ is obtained from the inverting output of op amp 320 and is fed back to resistor 350. As will be described more fully below, op amp 420 in FIG. 4 produces output signal $-Y_i$. The output signal $-Y_i$ is obtained from the output of op amp 420 in FIG. 4 and fed back to resistor 360 in FIG. 3. Lastly, the value of $\pm Y_i$ (obtained from the value of output signal $-Y_i$) is provided to resistor 355. It is noted that both polarities of the output signals $Y_r$ and $Y_i$ are necessary to correctly implement circuit 300 and circuit 400.

As in the case of circuit 100, the equation for the output $-Y_r$ of circuit 300 is:

$$-Y_r = \frac{X_r}{sR1C} - \frac{Y_r}{sR2C} \pm \frac{Y_i}{sR3C} - \frac{Y_i}{sR4C}. \quad (33)$$

Circuit 300 also comprises a second set of four resistors coupled in parallel. The second set of four resistors in circuit 300 includes resistor 365 having a value of R1 ohms, resistor 370 having a value of R2 ohms, resistor 375 having a value of R3 ohms, and resistor 380 having a value of R4 ohms. Resistors 365, 370, 375 and 380 are variable resistors and may be tuned by a resistor tuning device.

An output signal from each of the four variable resistors 365, 370, 375 and 380 is combined and fed into the non-inverting input of op amp 320. The non-inverting output of op amp 320 is coupled to the non-inverting input of op amp 320 through capacitor 340 having a value of C farads. Capacitor 340 may be a variable capacitor that may be tuned by a capacitor tuning device.

As shown in FIG. 3, the input signal $-X_r$ is connected to resistor 365. The output signal $Y_r$ is obtained from the non-inverting output of op amp 320 and is fed back to resistor 370. The output signal $Y_i$ is obtained from the non-inverting output of op amp 420 in FIG. 4 and fed back to resistor 380 in FIG. 3. Lastly, the value of $\mp Y_i$ (obtained from the value of output signal $Y_i$) is provided to resistor 375. It is noted that both polarities of the output signals $Y_r$ and $Y_i$ are necessary to correctly implement circuit 300 and circuit 400.

The equation for the output +Y$_r$ of circuit 300 is:

$$+Y_r = -\frac{X_r}{sR1C} + \frac{Y_r}{sR2C} \mp \frac{Y_i}{sR3C} + \frac{Y_i}{sR4C}. \quad (34)$$

Thus it is seen that circuit 300 of FIG. 3 comprises a differential form of circuit 100 of FIG. 1. It is noted and understood that the resistors and capacitors in circuit 300 may be tuned in the same manner as that described for tuning the resistors and capacitors in circuit 100 and in circuit 200.

Lastly, circuit 400 of FIG. 4 comprises two sets of four resistors coupled in parallel. The first set of four resistors in circuit 400 includes resistor 445 having a value of R1 ohms, resistor 450 having a value of R2 ohms, resistor 455 having a value of R3 ohms, and resistor 460 having a value of R4 ohms. Resistors 445, 450, 455 and 460 are variable resistors and may be tuned by a resistor tuning device.

An output signal from each of the four variable resisters 445, 450, 455 and 460 is combined and fed into the inverting input of op amp 420. The inverting output of op amp 420 is coupled to the inverting input of op amp 420 through capacitor 430 having a value of C farads. Capacitor 430 may be a variable capacitor that may be turned by a capacitor tuning device.

As shown in FIG. 4, the input signal X$_i$ is connected to resistor 445. The output signal −Y$_i$ is obtained from the inverting output of op amp 420 and is fed back to resistor 450. Op amp 320 in FIG. 3 produces output signal −Y$_r$. The output signal −Y$_r$ is obtained from the output of op amp 320 in FIG. 3 and fed back to resistor 460 in FIG. 4. Lastly, the value of ∓Y$_r$ (obtained from the value of output signal −Y$_r$) is provided to resistor 455. It has previously been noted that both polarities of the output signals Y$_r$ and Y$_i$ are necessary to correctly implement circuit 300 and circuit 400.

As in the case of circuit 200, the equation for the output −Y$_i$ of circuit 400 is:

$$-Y_i = \frac{X_i}{sR1C} - \frac{Y_i}{sR2C} \mp \frac{Y_r}{sR3C} + \frac{Y_r}{sR4C}. \quad (35)$$

Circuit 400 also comprises a second set of four resistors coupled in parallel. The second set of four resistors in circuit 400 includes resistor 465 having a value of R1 ohms, resistor 470 having a value of R2 ohms, resistor 475 having a value of R3 ohms, and resistor 480 having a value of R4 ohms. Resistors 465, 470, 475 and 480 are variable resistors and may be tuned by a resistor tuning device.

An output signal from each of the four variable resistors 465, 470, 475 and 480 is combined and fed into the non-inverting input of op amp 420. The non-inverting output of op amp 420 is coupled to the non-inverting input of op amp 420 through capacitor 440 having a value of C farads. Capacitor 440 may be a variable capacitor that may be tuned by a capacitor tuning device.

As shown in FIG. 4, the input signal −X$_i$ is connected to resistor 465. The output signal Y$_i$ is obtained from the non-inverting output of op amp 420 and is fed back to resistor 470. The output signal Y$_r$ is obtained from the non-inverting output of op amp 320 in FIG. 3 and fed back to resistor 480 in FIG. 4. Lastly, the value of ±Y$_r$ (obtained from the value of output signal Y$_r$) is provided to resistor 475. It has previously been noted that both polarities of the output signals Y$_r$ and Y$_i$ are necessary to correctly implement circuit 300 and circuit 400.

The equation for the output +Y$_i$ of circuit 400 is:

$$Y_i = -\frac{X_i}{sR1C} + \frac{Y_i}{sR2C} \pm \frac{Y_r}{sR3C} - \frac{Y_r}{sR4C}. \quad (36)$$

Thus it is seen that circuit 400 of FIG. 4 comprises a differential form of circuit 200 of FIG. 2. It is noted and understood that the resistors and capacitors in circuit 400 may be tuned in the same manner as that described for tuning the resistors and capacitors in circuit 100 and in circuit 200.

The above examples and description have been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. An apparatus for implementing a complex filter represented by a transfer function having a complex pole in the form:

$$H(j\omega) = \frac{A}{s + (p \pm jq)}$$

said apparatus comprising:
   an operational amplifier capable of creating an output signal −Y$_r$ where Y$_r$ is a real part of a complex output signal, said operational amplifier having a capacitor that couples an output terminal of said operational amplifier and an input terminal of said operational amplifier;
   an input circuit for providing an input signal to said operational amplifier wherein said input circuit comprises a first resistor having resistance R1, a second resistor having resistance R2, a third resistor having resistance R3, and a fourth resistor having resistance R4, said first, second, third, and fourth resistors connected in parallel,
   wherein said first resistor receives an input value of X$_r$, where X$_r$ is a real part of a complex input signal;
   wherein said second resistor receives an input value of −Y$_r$ where Y$_r$ is a real part of a complex output signal;
   wherein said third resistor receives an input value of Y$_i$ where Y$_i$ is an imaginary part of a complex output signal; and
   wherein said fourth resistor receives an input value of −Y$_i$ where Y$_i$ is said imaginary part of a complex output signal.

2. An apparatus as claimed in claim 1 wherein the value of the output −Y$_r$ of said operational amplifier is:

$$-Y_r = \frac{X_r}{sR1C} - \frac{Y_r}{sR2C} \pm \frac{Y_i}{sR3C} - \frac{Y_i}{sR4C}$$

where s is equal to −jω, and where C is a value of capacitance of said capacitor.

3. An apparatus as claimed in claim 2 wherein said value of resistance R1 of said first resistor is equal to 1/(AC) where A is a constant in said transfer function and where C is a value of capacitance of said capacitor;

wherein said value of resistance R2 of said second resistor is equal to 1/(pC) where p is a real part of said complex pole in said transfer function and where C is a value of capacitance of said capacitor;

wherein said value of resistance R3 of said third resistor is equal to 1/(qC) where q is an imaginary part of said complex pole in said transfer function and where C is a value of capacitance of said capacitor; and wherein said value of resistance R4 of said fourth resistor is equal to 1/($\omega_c$C) where $\omega_c$ is a center frequency of said complex filter and where C is a value of capacitance of said capacitor.

4. An apparatus as claimed in claim 2 wherein resistance values of said first, second, third, and fourth resistors are each independently variable.

5. An apparatus as claimed in claim 4 wherein said resistance values of said first, second, third, and fourth resistors are digitally tunable.

6. An apparatus as claimed in claim 2 wherein said first, second, third, and fourth resistors comprise resistors connected in an R–2R ladder.

7. An apparatus for implementing a complex filter represented by a transfer function having a complex pole in the form:

$$H(j\omega) = \frac{A}{s + (p \pm jq)}$$

said apparatus comprising:
  an operational amplifier capable of creating an output signal $-Y_i$ where $Y_i$ is an imaginary part of a complex output signal, said operational amplifier having a capacitor that couples an output terminal of said operational amplifier and an input terminal of said operational amplifier;
  an input circuit for providing an input signal to said operational amplifier wherein said input circuit comprises a first resistor having resistance R1, a second resistor having resistance R2, a third resistor having resistance R3, and a fourth resistor having resistance R4, said first, second, third, and fourth resistors connected in parallel,
    wherein said first resistor receives an input value of $X_i$ where $X_i$ is an imaginary part of a complex input signal;
    wherein said second resistor receives an input value of $-Y_i$ where $Y_i$ is an imaginary part of a complex output signal;
    wherein said third resistor receives an input value of $\mp Y_r$ where $Y_r$ is a real part of a complex output signal; and
    wherein said fourth resistor receives an input value of $-Y_r$ where $Y_r$ is a real part of a complex output signal.

8. An apparatus as claimed in claim 7 wherein the value of the output $-Y_i$ of said operational amplifier is:

$$-Y_i = \frac{X_i}{sR1C} - \frac{Y_i}{sR2C} \mp \frac{Y_r}{sR3C} + \frac{Y_r}{sR4C}$$

where s is equal to $j\omega$, and where C is a value of capacitance of said capacitor.

9. An apparatus as claimed in claim 7 wherein said value of resistance R1 of said first resistor is equal to 1/(AC) where A is a constant in said transfer function and where C is a value of capacitance of said capacitor;

wherein said value of resistance R2 of said second resistor is equal to 1/(pC) where p is a real part of said complex pole in said transfer function and where C is a value of capacitance of said capacitor;

wherein said value of resistance R3 of said third resistor is equal to 1/(qC) where q is an imaginary part of said complex pole in said transfer function and where C is a value of capacitance of said capacitor; and wherein said value of resistance R4 of said fourth resistor is equal to 1/($\omega_c$C) where $\omega_c$ is a center frequency of said complex filter and where C is a value of capacitance of said capacitor.

10. An apparatus as claimed in claim 8 wherein resistance values of said first, second, third, and fourth resistors are each independently variable.

11. An apparatus as claimed in claim 10 wherein said resistance values of said first, second, third, and fourth resistors are digitally tunable.

12. An apparatus as claimed in claim 8 wherein said first, second, third, and fourth resistors comprise resistors connected in an R–2R ladder.

13. An apparatus for implementing a complex filter represented by a transfer function having a complex pole in the form:

$$H(j\omega) = \frac{A}{s + (p \pm jq)}$$

said apparatus comprising:
  a first operational amplifier that creates an output signal $-Y_r$ where $Y_r$ is a real part of a complex output signal, said first operational amplifier having a first capacitor that couples an output terminal of said first operational amplifier and an input terminal of said first operational amplifier;
  a first input circuit for providing an input signal to said first operational amplifier wherein said first input circuit comprises a first resistor having resistance R1, a second resistor having resistance R2, a third resistor having resistance R3, and a fourth resistor having resistance R4, said first, second, third, and fourth resistors connected in parallel,
    wherein said first resistor receives an input value of $X_r$ where $X_r$ is a real part of a complex input signal;
    wherein said second resistor receives an input value of $-Y_r$ where $Y_r$ is a real part of a complex output signal;
    wherein said third resistor receives an input value of $\pm Y_i$ where $Y_i$ is an imaginary part of a complex output signal; and
    wherein said fourth resistor receives an input value of $-Y_i$ where $Y_i$ is an imaginary part of a complex output signal; and
  a second operational amplifier that creates an output signal $-Y_i$ where $Y_i$ is an imaginary part of a complex output signal, said second operational amplifier having a second capacitor that couples an output terminal of said second operational amplifier and an input terminal of said second operational amplifier;
  a second input circuit for providing an input signal to said second operational amplifier wherein said second input circuit comprises a fifth resistor having resistance R1, a sixth resistor having resistance R2, a seventh resistor having resistance R3, and an eighth resistor having resistance R4, said fifth, sixth, seventh, and eighth resistors coupled in parallel, wherein said fifth resistor receives an input value of $X_i$ where $X_i$ is an imaginary part of a complex input signal;

wherein said sixth resistor receives an input value of $-Y_i$ where $Y_i$ is an imaginary part of a complex output signal;

wherein said seventh resistor receives an input value of $Y_r$ where $Y_r$ is a real part of a complex output signal; and wherein said eighth resistor receives an input value of $-Y_r$ where $Y_r$ is a real part of a complex output signal.

14. An apparatus as claimed in claim 13 wherein the value of the output $-Y_r$ of said operational amplifier is:

$$-Y_r = \frac{X_r}{sR1C} - \frac{Y_r}{sR2C} \pm \frac{Y_i}{sR3C} - \frac{Y_i}{sR4C}$$

where s is equal to jω, and C is a value of capacitance of said first capacitor, and R1 is a value of resistance of said first resistor, and R2 is a value of resistance of said second resistor, and R3 is a value of resistance of said third resistor, and R4 is a value of resistance of said fourth resistor, and wherein the value of the output $-Y_i$ of said second operational amplifier is:

$$-Y_i = \frac{X_i}{sR1C} - \frac{Y_i}{sR2C} \mp \frac{Y_r}{sR3C} + \frac{Y_r}{sR4C}$$

where s is equal to jω, and C is a value of capacitance of said second capacitor, and R1 is a value of resistance of said fifth resistor, and R2 is a value of resistance of said sixth resistor, and R3 is a value of resistance of said seventh resistor, and R4 is a value of resistance of said eighth resistor.

15. An apparatus as claimed in claim 14 wherein said value of resistance R1 of said first resistor and of said fifth resistor is equal to 1/(AC) where A is a constant in said transfer function and where C is a value of capacitance of said first capacitor and of said second capacitor;

wherein said value of resistance R2 of said second resistor and of said sixth resistor is equal to 1/(pC) where p is a real part of said complex pole in said transfer function and where C is a value of capacitance of said first capacitor and of said second capacitor;

wherein said value of resistance R3 of said third resistor and of said seventh resistor is equal to 1/(qC) where q is an imaginary part of said complex pole in said transfer function and where C is a value of capacitance of said first capacitor and of said second capacitor; and wherein said value of resistance R4 of said fourth resistor and of said eighth resistor is equal to 1/(ω_cC) where ω_c is a center frequency of said complex filter and where C is a value of capacitance of said first capacitor and of said second capacitor.

16. An apparatus as claimed in claim 14 wherein resistance values of said first, second, third, fourth, fifth, sixth, seventh, and eighth resistors are each independently variable.

17. An apparatus as claimed in claim 16 wherein said resistance values of said first, second, third, fourth, fifth, sixth, seventh, and eighth resistors are digitally tunable.

18. An apparatus as claimed in claim 14 wherein said first, second, third, fourth, fifth, sixth, seventh, and eighth resistors comprise resistors connected in an R–2R ladder.

19. An apparatus as claimed in claim 14 wherein said first and fifth resistors form a resistor pair, said second and sixth resistors form a resistor pair, said third and seventh resistors form a resistor pair, and said fourth and eighth resistors form a resistor pair, and wherein a resistance value for each resistor pair is individually variable.

20. An apparatus as claimed in claim 19 wherein said resistance value of each of said resistor pairs is digitally tunable.

21. An apparatus for implementing a complex filter represented by a transfer function having a complex pole in the form:

$$H(j\omega) = \frac{A}{s + (p \pm jq)}$$

said apparatus comprising:

an operational amplifier that creates an output signal $-Y_r$ on an inverting output of said operational amplifier where $Y_r$ is a real part of a complex output signal, said operational amplifier having a first capacitor that couples an inverting output terminal of said operational amplifier and an inverting input terminal of said operational amplifier;

a first input circuit for providing an input signal to said inverting input terminal of said operational amplifier wherein said first input circuit comprises a first resistor having resistance R1, a second resistor having resistance R2, a third resistor having resistance R3, and a fourth resistor having resistance R4, said first, second, third, and fourth resistors connected in parallel, wherein said first resistor receives an input value of $X_r$ where $X_r$ is a real part of a complex input signal;

wherein said second resistor receives an input value of $-Y_r$ where $Y_r$ is a real part of a complex output signal;

wherein said third resistor receives an input value of $\pm Y_i$ where $Y_i$ is an imaginary part of a complex output signal; and wherein said fourth resistor receives an input value of $-Y_i$ where $Y_i$ is an imaginary part of a complex output signal; and wherein said operational amplifier is capable of creating an output signal $+Y_r$ on a non-inverting output of said operational amplifier where $Y_r$ is a real part of a complex output signal, said operational amplifier having a second capacitor that couples a non-inverting output terminal of said operational amplifier and a non-inverting input terminal of said operational amplifier;

a second input circuit for providing an input signal to a non-inverting input of said operational amplifier wherein said second input circuit comprises a fifth resistor having resistance R1, a sixth resistor having resistance R2, a seventh resistor having resistance R3, and an eighth resistor having resistance R4, said fifth, sixth, seventh, and eighth resistors coupled in parallel, wherein said fifth resistor receives an input value of $-X_r$ where $X_r$ is a real part of a complex input signal;

wherein said sixth resistor receives an input value of $Y_r$ where $Y_r$ is a real part of a complex output signal;

wherein said seventh resistor receives an input value of $\pm t\, Y_i$ where $Y_i$ is an imaginary part of a complex output signal; and wherein said eighth resistor receives an input value of $Y_i$ where $Y_i$ is an imaginary part of a complex output signal.

22. An apparatus for implementing a complex filter represented by a transfer function having a complex pole in the form:

$$H(j\omega) = \frac{A}{s + (p \pm jq)}$$

said apparatus comprising:

an operational amplifier that creates an output signal $-Y_i$ on an inverting output of said operational amplifier where $Y_i$ is an imaginary part of a complex output signal, said operational amplifier having a first capacitor that couples an inverting output terminal of said operational amplifier and an inverting input terminal of said operational amplifier;

a first input circuit for providing an input signal to said inverting input terminal of said operational amplifier wherein said first input circuit comprises a first resistor having resistance R1, a second resistor having resistance R2, a third resistor having resistance R3, and a fourth resistor having resistance R4, said first, second, third, and fourth resistors connected in parallel, wherein said first resistor receives an input value of $X_i$ where $X_i$ is an imaginary part of a complex input signal;

wherein said second resistor receives an input value of $-Y_i$ where $Y_i$ is an imaginary part of a complex output signal;

wherein said third resistor receives an input value of $\mp Y_r$ where $Y_r$ is a real part of a complex output signal; and wherein said fourth resistor receives an input value of $-Y_r$ where $Y_r$ is a real part of a complex output signal; and wherein said operational amplifier is capable of creating an output signal $+Y_i$ on a non-inverting output of said operational amplifier where $Y_i$ is an imaginary part of a complex output signal, said operational amplifier having a second capacitor that couples a non-inverting output terminal of said operational amplifier and a non-inverting input terminal of said operational amplifier;

a second input circuit for providing an input signal to a non-inverting input of said operational amplifier wherein said second input circuit comprises a fifth resistor having resistance R1, a sixth resistor having resistance R2, a seventh resistor having resistance R3, and an eighth resistor having resistance R4, said fifth, sixth, seventh, and eighth resistors coupled in parallel, wherein said fifth resistor receives an input value of $-X_i$ where $X_i$ is an imaginary part of a complex input signal;

wherein said sixth resistor receives an input value of $Y_i$ where $Y_i$ is an imaginary part of a complex output signal;

wherein said seventh resistor receives an input value of $\pm Y_r$ where $Y_r$ is a real part of a complex output signal; and wherein said eighth resistor receives an input value of $Y_r$ where $Y_r$ is a real part of a complex output signal.

* * * * *

UNITED STATES PATENT AND TRADEMARK OFFICE
CERTIFICATE OF CORRECTION

PATENT NO. : 6,549,066 B1
DATED : April 15, 2003
INVENTOR(S) : Brian Martin

It is certified that error appears in the above-identified patent and that said Letters Patent is hereby corrected as shown below:

Column 2,
Line 38, equation (11), delete "$H(j\omega)=H_r(j\omega)+j\,H_i(107)$" and insert
-- $H(j\omega)=H_r(j\omega)+j\,H_i(j\omega)$ --; and Column 3,
Line 6, equation (14a), delete "$Y_r(j\omega)=H_r(j\omega)\text{-}X_r(j\omega)\text{-}H_i(j\omega)X_i(j\omega)$" and insert
-- $Y_r(j\omega)=H_r(j\omega)X_r(j\omega)\text{-}H_i(j\omega)X_i(j\omega).$ --.

Signed and Sealed this

Twenty-first Day of February, 2006

JON W. DUDAS
*Director of the United States Patent and Trademark Office*